United States Patent
Zantow et al.

(12) 
(10) Patent No.: US 7,593,495 B2
(45) Date of Patent: Sep. 22, 2009

(54) METHOD FOR PERFORMING HIGH RESOLUTION PHASE ALIGNMENT OF MULTIPLE CLOCKS USING LOW RESOLUTION CONVERTERS

(75) Inventors: Alfred Robert Zantow, Elgin, IL (US); Ray Prado, Chicago, IL (US); Randy Olenz, Naperville, IL (US); Kurt Hedlund, Oak Park, IL (US); Steve Sanders, Hinckley, IL (US)

(73) Assignee: ARRIS Group, Inc., Suwanee, GA (US)

( * ) Notice: Subject to any disclaimer, the term of this patent is extended or adjusted under 35 U.S.C. 154(b) by 535 days.

(21) Appl. No.: 11/395,590

(22) Filed: Mar. 30, 2006

(65) Prior Publication Data
US 2006/0222127 A1 Oct. 5, 2006

Related U.S. Application Data

(60) Provisional application No. 60/666,664, filed on Mar. 30, 2005.

(51) Int. Cl.
*H04L 7/00* (2006.01)

(52) U.S. Cl. .................................................. 375/354
(58) Field of Classification Search ................. 375/354, 375/371, 357
See application file for complete search history.

(56) References Cited

U.S. PATENT DOCUMENTS

| | | | | |
|---|---|---|---|---|
| 5,754,437 A | * | 5/1998 | Blazo | 702/75 |
| 6,522,206 B1 | * | 2/2003 | Kornblum et al. | 331/1 A |
| 2002/0110211 A1 | * | 8/2002 | Bockelman | 375/371 |

* cited by examiner

*Primary Examiner*—Kevin Y Kim
(74) *Attorney, Agent, or Firm*—Troy A. Van Aacken; Robert J. Starr

(57) ABSTRACT

The offset between a reference clock output signal and a target clock output signal are measured during a predetermined period. Based on the measurement, an offset signal is generated. The offset signal is integrated into an average offset signal value, wherein the period of integration is the predetermined phase measurement time. The target clock is adjusted based on the average offset signal value so that the offset signal magnitude value approaches a predetermined limit. The process is iterated until the clocks are aligned within a predetermined tolerance.

11 Claims, 1 Drawing Sheet

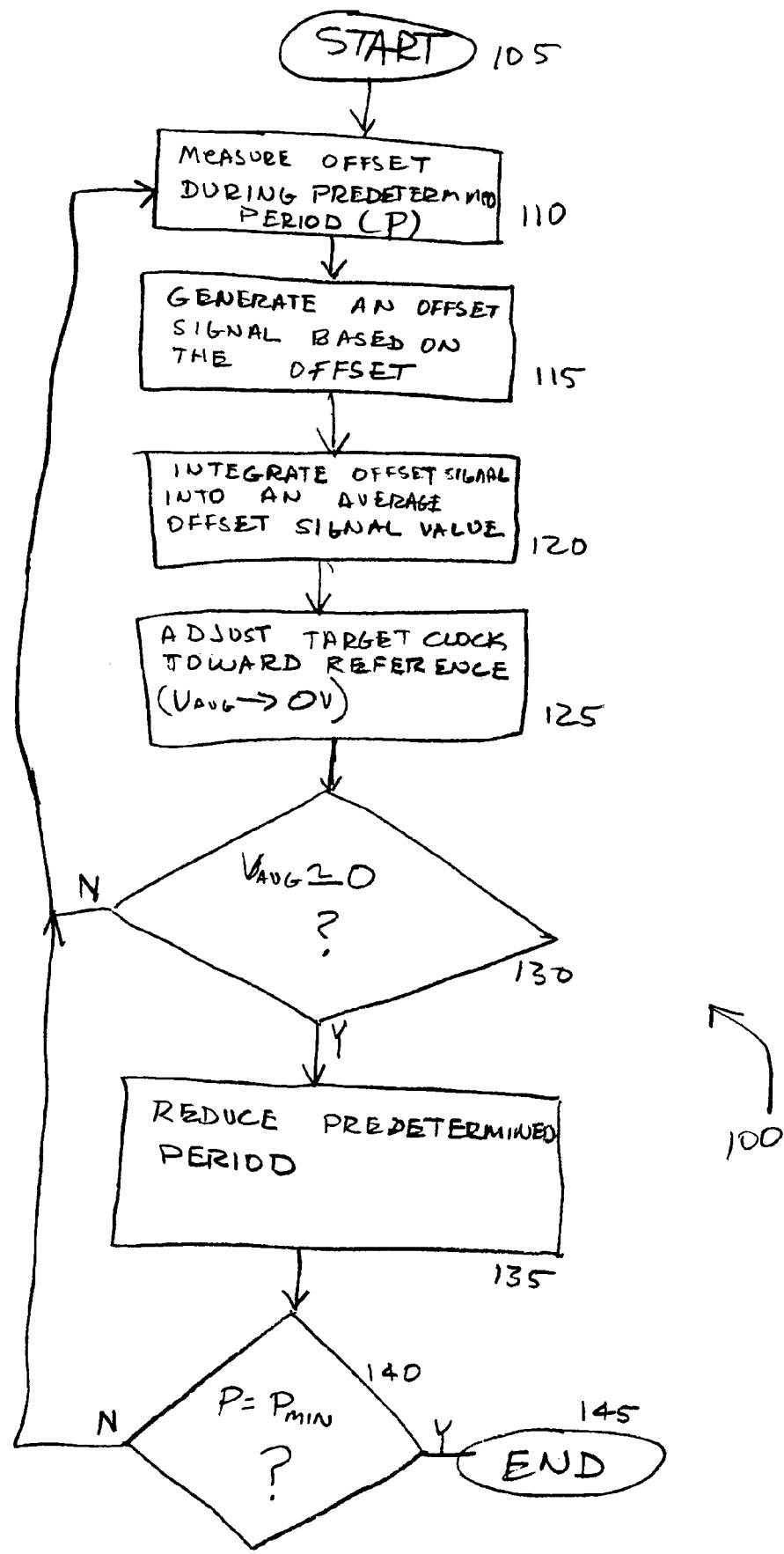

METHOD FOR PERFORMING HIGH RESOLUTION PHASE ALIGNMENT OF MULTIPLE CLOCKS USING LOW RESOLUTION CONVERTERS

CROSS REFERENCE TO RELATED APPLICATION

This application claims priority under 35 U.S.C. 119(e) to U.S. provisional patent application No. 60/666,664 entitled "Method for high-resolution phase alignment of multiple clocks in a system," which was filed Mar. 30, 2005, and is incorporated herein by reference in its entirety.

FIELD OF THE INVENTION

This invention relates, generally, to electrical circuits, communication networks and devices and, more particularly, to synchronizing clocks.

BACKGROUND

Data-Over-Cable Service Interface Specifications ("DOCSIS") has been established by cable television network operators to facilitate transporting data traffic, primarily internet traffic, over existing community antenna television ("CATV") networks. In addition to transporting data traffic as well as television content signals over a CATV network, multiple services operators ("MSO") also use their CATV network infrastructure for carrying voice, video on demand ("VoD") and video conferencing traffic signals, among other types.

DOCSIS signals are transmitted over the CATV networks, which may be coaxial networks, fiber networks, or a combination of both known as hybrid fiber-coaxial networks ("HFC"). MSOs typically provide DOCSIS service to subscribers' cable modems ("CM") from a cable modem termination system ("CMTS") located at the MSOs head end facility. In providing connectivity to a plurality of subscribers, multiple subscribers connect to multiple circuit cards in the CMTS. Each of these circuit cards contains analog and digital circuitry for transmitting and receiving signals up to approximately 750 MHz.

For a variety of reasons, including load balancing, for example, the channel frequency to which a CM and CMTS use for communication may be changed. Often when a change is made, the CMTS uses a different card for communicating via the new frequency. Since the frequency is high, and the operation at such frequencies depends on a stable clock frequency, a connection may be lost when changing from one card to another if the respective clocks on the old and new cards are not in phase within a given tolerance. This tolerance is typically approximately 1 nS. As known in the art, phase detection/correction circuits may use a detector and an A/D converter to generate and provide a signal to a clock to cause it to shift, thus aligning it with another clock.

To achieve a 1 nS resolution, a 24 bit A/D converter would be needed to detect such a small offset over a 10 mS clock, for example. However, in a 3V system, a noise signal of just 180 pV could induce error into the phase detection process, thereby causing a shift of too much or too little. In addition, a 24 bit A/D converter is typically more costly and complex than one that provides lower resolution conversions, such as 8 or 10 bit converters.

Thus, there is a need in the art for a method and system for phase-aligning multiple clocks with a reference that provides adequate resolution and that is resistant to noise-induced error.

BRIEF DESCRIPTION OF DRAWINGS

FIG. 1 illustrates a flow diagram for a method for phase-aligning one or more clocks to a reference. These clocks may be local to the same circuit, or may be dispersed across a system, or multiple systems.

DETAILED DESCRIPTION

As a preliminary matter, it will be readily understood by those persons skilled in the art that the present invention is susceptible of broad utility and application. Many methods, embodiments and adaptations of the present invention other than those herein described, as well as many variations, modifications, and equivalent arrangements, will be apparent from or reasonably suggested by the present invention and the following description thereof, without departing from the substance or scope of the present invention.

Turning now to the figures, FIG. 1 illustrates a flow diagram of a method 100 for synchronizing, or phase-aligning one or more clocks to a reference. Method 100 starts at step 105 and measures the offset between a target clock output signal and a reference clock output signal at step 110. Typical analog phase detection circuitry may be used to measure the offset and provide an offset output signal at step 115. The offset signal is then integrated at step 120 into an average offset signal, typically using a simple RC filter, where the average offset signal is taken across the capacitor.

The average offset signal is then fed back to the target clock (the clock to be adjusted to be phase-matched with the reference clock) at step 125 so that the phase of the target clock moves toward the reference. In other words, the phase of the target clock is shifted so that when the reference and target clocks are measured again, the phase difference will be less than upon the previous measurement. Generally, an average offset signal having a voltage of zero represents phase alignment, and a voltage of Vcc indicates that the reference and the target clocks are 180 degrees out of phase. It will be appreciated that an average offset signal of zero only indicates that the reference and target clock signals differ in phase less that an amount represented by the least significant bit ("LSB") of the A/D converter. For example, for an 8-bit A/D converter, the phase difference that could exist when the average offset signal is zero could be greater than when the average offset signal has a voltage amount represented by the LSB of a 10 bit converter.

At step 130, a determination is made whether the average offset signal is approximately (within a given tolerance) zero. If not, process 100 returns to step 110 and continues as described above. If, however, the average offset signal is approximately equal to zero, as may be determined by comparing how much the target clock is adjusted with respect to the phase difference measured at step 110, method 100 advances to step 135. At step 135, the predetermined period P during which phase differences are measured at step 110 is reduced. A determination is made at step 140 whether 'zooming in' on the phase difference measurement by reducing the period over which the phase detector measures the difference can achieve further clock synchronization improvementsBy repeatedly 'zooming in', resolution is improved as compared with a simple PLL.

The determination whether to zoom in is based on a few factors. These include the bit resolution of the A/D converter being used, speed in synchronizing the clocks versus the accuracy desired and the duty cycle of the clock pulses (if the duty cycle is 50%, then reducing the evaluation period by half at each iteration of step 135 ensures that portions of the clocks containing misaligned edges will be evaluated).

If at step 140 a determination is made that zooming in can improve synchronization between the reference clock and the target clock, process 100 follows the 'N' path and returns to step 110. After returning from step 140, the target clock and the reference clock are compared to determine the amount out-of-phase the two clocks are as discussed above. However, the two clock signals are only compared over the new period P as determined at step 135. This is accomplished by placing the tristatable phase detector in the high impedance state (output of the detector is essentially open circuit) after the predetermined period has elapsed following the beginning of a clock period (whichever occurs first between the target and the reference).

To facilitate describing the operation of method 100, the steps of the method are matched with an illustrative example as follows. For a baud clock rate of approximately 5 MHz, a common factor of 5 MHz and 10.24 MHz is 10 KHz. A 10 KHz common clock is also related to 10.24 MHz by common factor 1024. Thus dividing baud clock rate 5 MHz by 500 and dividing 10.24 MHz by 1025 results in both clock signals being 'divided down' to the 10 KHz common clock frequency. The 10 KHz common clock has a corresponding period P of 100 uS.

Accordingly, at step 110, phase detection occurs over a period of 100 uS during the first pass through method 100. In a typical XOR gate detector, for example, if the two 10 KHz clock signals are 100% aligned, the output of the detector is 0V. If they are 50% aligned, the detector output will be Vcc/2 and if they are 0% aligned the output will be Vcc. The corresponding step in FIG. 1 where these offset signals are generated is step 115. The output of the detector is integrated using an RC circuit/integrator at step 120 and a control/adjust signal is returned to the control register for the target clock at step 125. At step 130 a determination is made whether the phase difference after adjustment is within a predetermined tolerance range of zero. If not, the process returns to step 110.

If at step 130 the integrated output $V_{AVG}$ is zero within the predetermined tolerance, the process advances to step 135, where the period P is reduced. This is accomplished by reducing the number of clock cycles the detector evaluates differences between the target and reference clock signals. If P is already at a minimum (generally one clock pulse), the process ends at step 145. If P is not already at a minimum, an instruction corresponding to the reduced period P determined at step 135 is returned to the target clock and measurement of the phase difference between target and reference clocks is made again at step 110.

For example, if the initial phase difference was 50%, the phase detector outputs a high voltage for 125 clock pulses, then low voltage for each of the next 125 pulses, then high for 125 pulses and finally low for the last 125 pulses. Thus, since half of the 500 pulses (based on dividing the baud clock down by 500) are high and the other half low, the output of the RC integrator is one half of the high voltage applied to the integrator circuit, or ½Vcc. If the phase error is adjusted by the instruction generated at step 125 so that the reference and target clock pulses are now only 4% misaligned, then the detector output would be 10 high voltage pulses followed by 240 lows, another 10 highs and finally another 140 lows. Thus, the output of the integrator would be Vcc/24 (because $20/480=1/24$).

However, if the detector's tristateable feature is used the period P can be reduced by instructing the detector to output high Z for a number of clock pulses. For example, P can be reduced to 5% of the original period by instructing the detector to output high Z for the last 475 of the 500 pulses. Thus, in the example scenario above, for the first 10 clock pulses, the detector would output corresponding high voltage pulses followed by 15 low voltage pulses, but then followed by 475 high Z, or open circuit, 'pulses'. Now the output of the integrator is Vcc×10/25, which is roughly ten times higher than the Vcc/24, and which is thus much higher in the range of the A/D converter. Therefore, even though the converter is only an 8 or 10 bit converter, the LSB of the converter now represents 5 nS rather than 100 nS.

In another embodiment, an analog approach may be used, where the phase detector output is not digitized by an A/D, but instead applied to an analog phase adjustment circuit. There may or may not be gain scaling and/or sample and hold circuits that would be switched or adjusted as part of the iterative adjustment process.

In yet another embodiment, an all digital phase detection section may be used. The onboard 51.84 MHz clock may be used to count the number of high voltage pulses versus low voltage pulses are produced at the output of the XOR detector. The resolution is the period, or 1/freq, of the sample clock signal.

An enhancement of this technique is to measure the time for the count to change when the clocks are unlocked and slowly sliding past each other. This rate of change can be used to interpolate a phase setting between two clock edges of the sample clock.

It will be appreciated than in some CMTS installations, the CMTS may comprise multiple cards for providing connectivity to a plurality of cable modems. For the same CMTS 'rack', multiple types of cards may be used for providing connectivity to different modems at different rates. For example, one modular card may provide downstream service at 64QAM and another card may provide downstream service at 256QAM. Furthermore, the CMTS rack may use 51.84 MHz clock for various functions and a 405 KHz 'Fabric Sync' clock pulse signal.

Next will be described a method for sending the 'sync' message to the target clock. To synchronize the various clock signals and their sources in the CMTS, different clock frequencies are 'divided down', as discussed above, into a clock signal having a frequency, or rate, that is common between the clocks to be synchronized. Since 10.24 MHz is typically the fixed clock from which other signals are derived, the others are typically associated with an M/N ratio that relates the clock in question to 10.24 MHz. The ratio is expressed as a ratio of integers because the 10.24 Reference and the target clock need to be divided down so that the leading edge of each coincide periodically when they are 100% aligned.

Thus, in a 64QAM system used in the United States, a baud rate of 5.056941 MHz is used, and this results in an M/N ratio of 401/812. Accordingly, 12.61 KHz is a common factor of the clocks because 10.24 MHz/812=12.61 KHz and 5.056941 MHz/401=12.61 KHz. In other words, the leading edge of the divided down reference clock and the divided down target clock should coincide every $1/12.61$ KHz, or once every 793.0214 mS.

Multiple reference clock synchronization signals may be multiplexed onto a common sync signal by setting the appropriate bit position corresponding to when the various M/N's of reference clocks are aligned. This can be extended to M/N/S, where S is a system sync signal that is a superset of all the reference clocks to be synchronized.

Accordingly, while the present invention has been described herein in detail in relation to preferred embodiments, it is to be understood that this disclosure is only illustrative and exemplary of the present invention and is made merely for the purposes of providing a full and enabling disclosure of the invention. The following disclosure is not intended nor is to be construed to limit the present invention or otherwise to exclude any such other embodiments, adaptations, variations, modifications and equivalent arrangements, the present invention being limited only by the claims appended hereto and the equivalents thereof.

These and many other objects and advantages will be readily apparent to one skilled in the art from the foregoing specification when read in conjunction with the appended drawings. It is to be understood that the embodiments herein illustrated are examples only, and that the scope of the invention is to be defined solely by the claims when accorded a full range of equivalents.

What is claimed is:

1. A method for synchronizing system clocks, comprising:
   measuring the offset between a reference clock output signal and a target clock output signal during a predetermined period;
   generating an offset signal based on the measured offset;
   integrating the offset signal into an average offset signal value, wherein the period of integration corresponds to the predetermined amount of time over which the offset is measured;
   adjusting the target clock's output signal based on the average offset signal value so that the offset signal magnitude value approaches a predetermined limit; and
   if the offset signal magnitude value reaches the predetermined limit, reducing the predetermined period during which the offset is measured.

2. The method of claim 1 further comprising digitizing the average measured offset signal value into a digitized average offset signal value using an A/D converter.

3. The method of claim 2 wherein the A/D converter is a low resolution A/D converter.

4. The method of claim 3 wherein the resolution of the A/D converter is 8-bits.

5. The method of claim 3 wherein the resolution of the A/D converter is 10-bits.

6. The method of claim 2 wherein the steps thereof are repeated until a predetermined number of most significant bits of the digitized offset signal value are zero.

7. The method of claim 6 wherein the predetermined number of most significant bits is all of the most significant bits of the A/D converter.

8. The method of claim 1 further comprising:
   receiving the average offset signal value at an analog phase adjustment circuit; and
   applying the average offset signal value to the target clock using an analog phase adjustment circuit.

9. The method of claim 8 wherein the analog phase adjustment circuit scales its gain based on the average offset signal value and applies its output to an analog phase adjustment input to the target clock.

10. The method of claim 8 wherein the analog phase adjustment circuit samples the average offset signal and holds its output at a proportionally corresponding to the level of the signal sample level until the next iteration of the steps recited in claim 1.

11. The method of claim 1, further comprising:
    if the offset signal magnitude value reaches the predetermined limit. conditionally reducing the predetermined period during which the offset is measured, the conditional reduction based upon one or more of the following factors: bit resolution of an analog to digital converter used to digitize the offset, speed of synchronizing the target and reference clocks, accuracy desired for synchronization of target and reference clocks, and duty cycle of the target and reference clocks.

* * * * *